Sept. 19, 1961 S. GILMAN 3,000,797

METHOD OF SELECTIVELY PLATING PN JUNCTION DEVICES

Filed May 1, 1959

INVENTOR
SOL GILMAN

BY Everett A. Gartrell

ATTORNEY

United States Patent Office 3,000,797

Patented Sept. 19, 1961

3,000,797

METHOD OF SELECTIVELY PLATING PN JUNCTION DEVICES

Sol Gilman, Poughkeepsie, N.Y., assignor to International Business Machines Corporation, New York, N.Y., a corporation of New York Filed May 1, 1959, Ser. No. 810,441

2 Claims. (Cl. 204—15)

This invention relates to the method of selectively plating PN junction devices such as diodes and transistors. While the method of the invention is applicable to plating PN junction devices generally, it is particularly useful in plating PN junction devices which include one or more alloy junctions. Accordingly, the invention will be described in that environment.

Semiconductor devices having rectification barriers therein are sometimes referred to as PN junction devices. The PN junctions thereof comprise zones of P-type and N-type semiconductor material separated by a rectification barrier which has a high resistivity to electrical current flowing in one direction and a low resistivity to such flow in the opposite direction. Semiconductor diodes and transistors are two types of semiconductor devices, the diode having a single PN junction while the transistor has two or more such junctions.

Semiconductor devices may be prepared in three ways or in combinations thereof. According to one procedure, the regions of different conductivity with the PN junctions therebetween are formed by a crystal-drawing process wherein a crystal is drawn from a molten semiconductor material to which selected active impurity metals are added in a predetermined order. In accordance with another technique, the semiconductor body of a given conductivity type is exposed to the vapor of an active impurity which diffuses into the body and creates a rectification barrier and also a region having electrical properties complementary to that of the starting body. Pursuant to a third method, known as the alloy process, a pellet or dot of an active impurity is alloyed at an elevated temperature to a wafer of semiconductor material of a conductivity type opposite that imparted by the impurity dot. Active impurities are classified as either donors, such as antimony, arsenic, and phosphorous, or as acceptors such as indium, gallium, boron, and aluminum. Donor impurity dots are alloyed to the P-type semiconductor starting wafers and N-type impurity dots are alloyed to the P-type wafers. These semiconductor wafers are monatomic semiconductor crystalline members of germanium, silicon, germanium-silicon alloy, or intermetallic compounds such as indium antimonide, aluminum arsenide, aluminum antimonide, and others having the properties of a semiconductor material. Semiconductor devices may also be made by employing a diffusion technique for making one junction of a transistor and an alloying technique for making its other junction.

In the manufacture of semiconductor devices such as transistors, it is customary after the fabrication of the junctions to subject them to chemical or electrolytic etching operations to remove deleterious and short circuiting material which is created about the junction during their fabrication. Particularly advantageous techniques are disclosed and claimed in the copending application of Jerry Leff, Serial No. 803,190 filed March 31, 1959, entitled "Semiconductor Device and Methods of Etching It," and assigned to the same assignee as the present invention. This may be followed by the plating of the transistor base region with a highly conductive metal to reduce the series base lead resistance of the transistor. This plating not only reduces the extent to which signals applied to the base lead or terminal are attenuated but also serves to improve the high-frequency performance of the transistor.

It is important that the conductive plating on the surface of the base region of the transistor not come into contact with the emitter and collector regions thereof since this would create a pair of short circuits or low-impedance paths that would render the transistor inoperative or would greatly impair its electrical characteristics. To avoid this possibility, one procedure employed in the past has been to cover or mask the critical junctions and the emitter and collector electrodes with a stop-off lacquer which is unaffected by the plating solution. Because of the extremely small size of the elements of the transistor, this masking procedure has proved to be a tedious, difficult, and rather inaccurate operation. After the base-plating operation, it was necessary to remove this lacquer. Manifestly, these masking and cleaning operations did not lend themselves to mass production techniques.

In accordance with another prior technique for plating the base region of a transistor, instead of employing a stop-off lacquer as described above, poorly adherent porous conductive plating is permitted to form on the emitter and base electrodes and on the junctions. This porous plating must be removed by a subsequent operation which involves immersing the transistor in a solution such as hydrochloric acid. The edges of the remaining plating on the base region of the transistor have been found to be jagged and apparently trap moisture thereunder which creates an undesired low-impedance path. Furthermore the junctions may be contaminated so as to require an additional clean-up electrolytic etching operation. These etching steps manifestly are additional manufacturing operations which undesirably increase handling and production costs.

It is an object of the invention, therefore, to provide a new and improved method of selectively plating transistors which avoids one or more of the disadvantages of prior transistor plating techniques.

It is another object of the invention to provide a new and improved method of selectively plating transistors which is simple, effective, and well suited to mass production techniques.

In accordance with a particular form of the invention, the method of selectively plating a transistor of semiconductor material which includes in succession a collector region, a rectification barrier, a diffused base region, a rectification barrier, and an emitter region comprises exposing the transistor to the influence of a metal plating solution while simultaneously applying selected potentials which maintain the base region (*a*) cathodic with respect to an electrode immersed in that solution and (*b*) more cathodic by an adjustable amount with respect to the emitter region than it is with respect to the collector region, whereby the flow of plating current for an interval of time is ineffective to plate with the metal of the solution the aforesaid collector and emitter regions and the barriers but is effective to plate with that metal an area of the base region having a size which is controllable by the selected potential difference appearing between the base region and the electrode and also by the selected potential difference between the emitter and collector regions.

The foregoing and other objects, features and advantages of the invention will be apparent from the following more particular description of preferred embodiments of the invention, as illustrated in the accompanying drawing.

Figure 1:
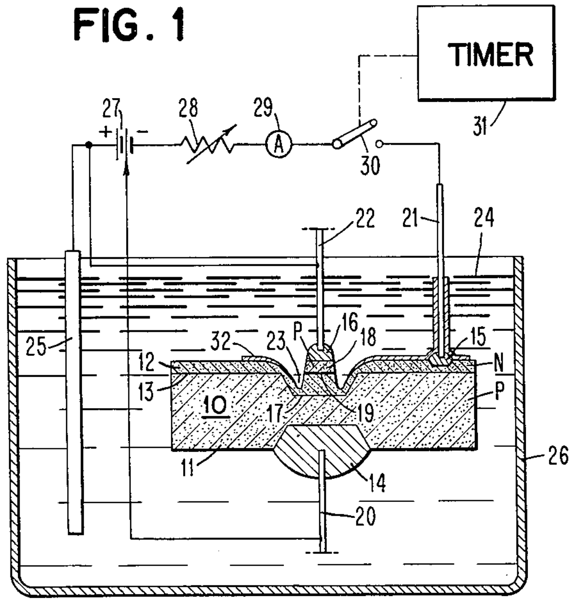
FIGURE 1 is a view, partly in section, representing a PN junction device and the apparatus for plating it in accordance with the method of the present invention.

Referring now more particularly to the FIGURE 1 of the drawing, the PN junction device to be selectively plated in accordance with the method of the invention is represented as a transistor 10 of the type described and claimed in the copending application of Robert S. Schwartz and Bernard N. Slade, Serial No. 664,069, filed July 6, 1957, entitled "High Speed Transistor and Method of Making Same," and assigned to the same assignee as the present invention. It will be understood, however, that other types of transistors and PN junction devices such as semiconductor diodes may also be plated by the method of the present invention. The transistor 10 comprises a P-type starting wafer 11 of suitable semiconductor material such as germanium having a first region or layer 12 of an N-type impurity such as antimony formed thereon in a conventional manner as by evaporation followed by diffusion at elevated temperature. These operations create a rectification barrier 13 between the wafer 11 and the layer 12 and in turn produce a first PN junction. The layer 12 forms an exponentially graded base region which has its greatest impurity concentration and hence greatest conductivity at its outer surfaces. A lead-gallium collector dot 14 is alloyed to the bottom of the wafer 11 in a conventional manner to form an ohmic collector connection wtih the base wafer 11, and a lead-antimony dot 15 is similarly alloyed to the N-type region to form an ohmic connection thereto.

A lead-gallium-antimony dot 16 containing about 99.3% lead, 0.5% gallium, and 0.2% antimony is alloyed to the wafer 11. At the alloying temperature, the emitter dot melts or dissolves a portion of the germanium wafer 11 thereunder and forms a recess 17 therein. Since the antimony in the dot has a higher diffusion coefficient than that of the gallium, it diffuses into the solid P-type material immediately surrounding the recess and converts the surrounding material into N-type which is electrically connected to the previously diffused N-type layer 12. As the assembly cools, the molten mass of lead, germanium, gallium, and antimony begins to solidify and, because the segregation coefficient of the gallium is higher than that of antimony, a recrystallized P-type region 18 develops which serves as the emitter and presents a rectification barrier 19 or PN junction with the adjoining N-type layer 12. Suitable leads 20, 21, and 22 are attached to the alloy dots 14, 15 and 16 in a conventional manner to complete the terminal structures of the device.

In accordance with the etching procedure described in the above-identified copending application of Jerry Leff, the transistor 10, after being formed in the manner briefly described above, is electrolytically etched in an aqueous solution of acetic acid and hydrogen peroxide, followed by a rinsing, and then a second electrolytic etching in a dilute hydroxide solution which cuts an annular groove 23 in the transistor by removing the low impedance semiconductor material and the short circuiting metal alloy formed about the peripheral region of the junction during the described alloying operation. The acetic acid and hydrogen peroxide itching procedure materially improves the electrical characteristics of the transistor.

From the foregoing description of the transistor 10, it will be seen that a first region of the PN junction device or transistor may be considered as comprising the layer 12 of N-type material electrically disposed on one side of the rectification barrir 19 while the region of P-type material 18 and its associated conductive terminal or dot 16 may be considered as electrically disposed on the other or upper side of the barrier 19. To reduce the series base lead resistance of the transistor 10, it is desirable selectively to plate at least a portion of the surface of the base region 12 with a conductive material while simultaneously preventing the plating from forming over the rectification barrier 19 as well as the other rectification barrier 13. This is accomplished in the manner which will be explained hereinafter.

Transistor 10 may be plated by exposing it to the influence of a metal-plating solution 24 with the body or N-type region 12 maintained at a potential which is negative with respect to an electrode 25 immersed in the solution and with respect to the terminal 16, whereby the flow of plating current for an interval of time is effective to plate the region 12 but is ineffective to plate the terminal 16 and the barrier 19. To this end, the transistor 10 is preferably immersed in the solution 24 which is held in a container 26. The metal plating solution may, for example, comprise any one of a number of well-known solutions capable of plating a conductive layer such as copper, gold, lead, or silver on the region 12. A gold plating solution is commonly employed for this purpose and may, for example, comprise 0.17 oz. of potassium gold cyanide per gallon of water, one ounce of sodium cyanide per gallon of water, and two oz. of disodium phosphate per gallon of water, the solution preferably being maintained at a temperature in the range of from 140 to 160 degrees F. during the plating operation. The electrode 25, which may be a stainless steel or carbon anode, is connected to the positive terminal of a source such as a battery 25 as is also the lead 22 and the emitter terminal comprising the alloy dot 16. The lead 20 and the collector dot 14 are also connected to a positive terminal of the battery 27 which may be less positive than the one connected to electrode 25 for a purpose to be mentioned subsequently. The negative terminal of the battery is connected through a current-controlling resistor 28, an ammeter 29, and a switch 30 to the lead 21 associated with the emitter dot 15. The operation of the switch 30 may be controlled in a well-known manner by a conventional timer 31 which regulates the duration of the current flow.

*Explanation of FIG. 1 plating operation*

When the switch 30 is closed, the apparatus of FIG. 1 is conditioned to plate those regions of the transistor connected to the negative terminal of the source 27. Since it is desired that the N-type base region 12 receives a thin, uniform, adherent plating of good quality, it will be recognized by those skilled in the art that it will be necessary to establish the proper plating current and to permit it to flow for an adequate interval of time. The conductivity of the solution the size of the various alloy dots, such as the emitter and base dot 16 and 15, and the extent of the area to be plated are some of the important factors entering into the plater's consideration. Too low a current flow, as evidenced by the ammeter 29, may mean insufficient current flow from the electrode 25 through the plating solution 24 to the transistor for the purpose of plating the selected region of that device. On the other hand, excessive current may result in a poor quality or blistered plating. For a transistor of a given geometry, it is usually necessary, as is well understood in the art, to perform one or more sample or test plating operations followed by microscope examination of the plating to determine its quality. When the desired parameters have been established to effect a plating of good quality, subsequent plating operations may be carried out on other transistors of the same type and geometry by following the established procedure. For example, in gold plating a germanium PNP transistor of the type represented in FIG. 1 which is of the sort described in in the above-identified application of Schwartz and Slade, wherein the base wafer 11 is 60 mils in diameter and 2.5 mils in thickness, the emitter and base starting dots are 4 and 6 mils in diameter, respectively, and spaced by about 15 mils, and the collector starting dot is 8 mils in diameter, a 15 milliampere current flowing for 3 minutes serve to deposit an adherent plating 32 of good quality on the surface of the N-type material 12.

Figure 2:
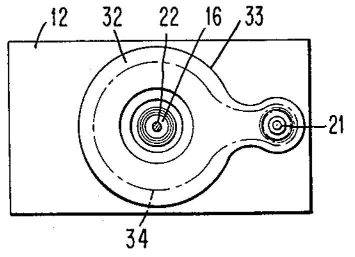
FIGURE 2 is a top plan view of the PN junction device of FIGURE 1.

It will be seen from the representation of FIG. 1 that the plating 32 extends over at least a portion of the N-type region and over the alloy dot 15 and also adheres to the portion of the lead 21. The periphery of the plating 32 ordinarily has the configuration represented by the curved line 33 of FIG. 2. The reduction in the magnitude of the plating current consistent with a metal plating of good quality will reduce the periphery of the plated area to a limit such as that confined within the dot-dash line 34 of FIG. 2. Conversely, increasing the plating current within limits will serve to increase the periphery of the plating 32.

The positive potential applied to the emitter and collector dots 16 and 14 prevents a metal plating from forming thereon since they are connected with relation to the regions to be plated in a sense which promotes a slight etching action. It has been found that this connection of the positive terminals to the emitter and collector dots not only prevents plating on the dots but also prevents the rectification barrier and possibly the P-type region and the N-type region immediately adjoining the barrier from being plated so as to create a low impedance or short circuiting path across the barrier 19. While it is not known how close the plating 32 approaches that barrier, it is believed to come very close to the barrier. Tests on transistors after this plating indicate that the transistors have such good performance that it is unnecessary to perform subsequent chemical or electrical etching steps to improve upon performance.

Since the plating is effected in the immediate vicinity of the emitter-base junction, it will be appreciated that this junction is the critical one from the standpoint of being short circuited. However, by connecting the collector dot 14 which makes an ohmic contact with the P-type collector region 11 to a positive terminal of the source 27, the collector dot, the collector region 11, and the collector-base rectification barrier 13 receive a mild etching treatment which prevents them from being plated, thus avoiding impairing their performance when the transistor 10 is removed from the bath and placed in operation. The connection of the collector dot 14 to a terminal of source 27 which is less positive than the terminal to which the emitter dot 16 is connected is useful in controlling the shape or size of the conductive plating 32. When the collector dot 14 is less positive than the emitter dot 16, the periphery of the plated region may extend to the curved line 33 of FIG. 2. Conversely, a more positive potential on the collector dot than that represented will reduce the periphery to the size represented by the dot-dash line 34. It will be seen, therefore, that the size of the plated region 32 may thus be controlled within limits without modifying the plating current which flows from the anode 25 to the N-type layer 12.

While the selective plating method of the present invention has been described in connection with a PNP transistor, the same technique may be employed in the selective plating of an NPN transistor.

Figures 3, 4:
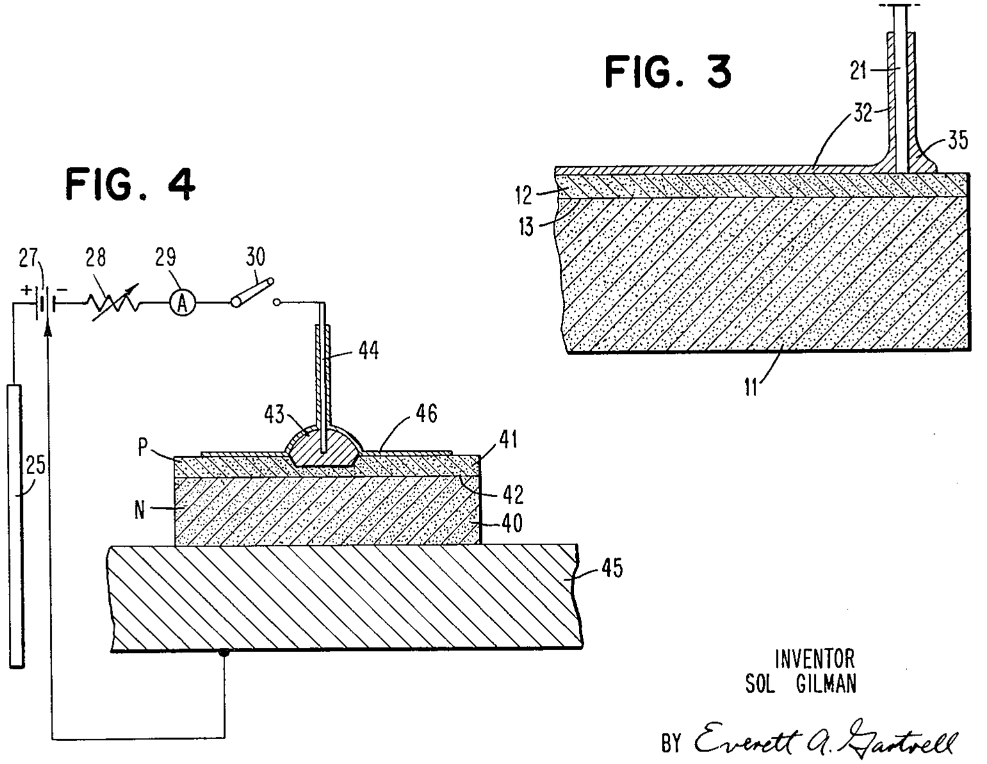
FIGURE 3 is an enlarged sectional view of a portion of a device similar to the one of FIGURE 1.
FIGURE 4 is a sectional view of another type of PN junction device being plated in accordance with the method of the invention.

*Description of FIG. 3 device*

For some applications, particularly where the size of one or more of the semiconductor regions is small, it may be desirable simultaneously to plate a given region of the device with a conductive material while simultaneously attaching a lead thereto. FIG. 3 is an enlarged fragmentary sectional view of a transistor similar to that of FIG. 1 and differs from the right hand portion thereof only in the manner in which the base lead 21 is secured to the N-type base region 32. Accordingly, corresponding elements in FIG. 3 are designated by the same reference numerals employed in FIG. 1. It will be seen that the FIG. 3 device lacks the base dot 15 of FIG. 1. However, the lead 21, which is a fine wire similar to a cat's whisker, is brought into mechanical and electrical contact with the N-type material 12 and is maintained in the position represented during the interval the metal plating 32 is formed on the layer 12. There is simultaneously built up around the contacting end of the wire an enlargement 35 of conductive plating material which serves not only to bond or anchor the lead to the base region 12 and the plating 32 but also to provide a satisfactory electrical connection thereto.

*Description of FIG. 4 device and apparatus and explanation of plating operation*

While the method of selectively plating a PN junction has been described in connection with a transistor, it is also useful in selectively plating a semiconductor diode. FIG. 4 is a sectional view representing such a diode being plated by apparatus similar to that of FIG. 1, only a portion of the apparatus being represented for convenience. Corresponding reference numerals are employed in the two figures just mentioned to designate corresponding elements. The semiconductor diode includes an N-type starting wafer 40 of suitable material such as germanium to which a first region or layer 41 of P-type material is attached in any well-known manner to establish a rectification barrier 42. An alloy dot 43 containing a P-type impurity is alloyed to the layer 41 to form an ohmic contact on one side of the barrier 42 and a lead 44 is secured to the dot in the conventional manner to complete the terminal structure. A metallic conductor such as a copper plate 45 is secured to one surface of the wafer 40 as by soldering and serves as a conductive terminal and heat dissipating element on the other side of the rectification barrier 42.

When the PN junction device is immersed in a metallic plating solution of the type described above and the switch 30 is closed just as in FIG. 1, a conductive plating 46 is deposited on the P-type layer 41 since it is associated with the negative terminal of the source 27. Plating does not occur over the rectification barrier 42 nor does it appear on N-type region 40 and the plate 45 for reasons mentioned above in connection with the FIG. 1 transistor. It will be seen that the arrangement of FIG. 4 differs somewhat from that of FIG. 1 in that a reverse bias is applied to the PN junction of FIG. 4 whereas a forward bias is applied to the PN junctions of FIG. 1. Thus the selective plating method of the present invention is effective regardless of the type of bias which is imposed across one or more of the PN junctions of the device being plated.

From the foregoing, it will be clear that in the semiconductor diode of FIG. 4 the P-type layer 41 is a first region of semiconductor material electrically disposed on one side of the rectification barrier 42 and that the N-type wafer 40 and the copper plate 45 constitute a second region of semiconductive material and a conductive terminal electrically disposed on the other side of the rectification barrier.

From the foregoing description and explanation of the invention, it will be seen that the method of selectively plating a PN junction device is effective to perform that operation without impairing or contaminating any rectification barriers of that device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of selectively plating a transistor of semiconductor material which includes in succession a collector region, a rectification barrier, a diffused base region, a rectification barrier, and an emitter region comprising: exposing said transistor to the influence of a metal plating solution while simultaneously applying selected potentials which maintain said base region (*a*) cathodic with respect to an electrode immersed in said solution and (*b*) more cathodic by an adjustable amount with respect to said emitter region than it is with respect to said collector region, whereby the flow of plating current for an interval of time is ineffective to plate with said metal of said solution said collector and emitter regions and said barriers but is effective to plate with said metal an area of said base region having a size which is controllable by the selected potential difference appearing between said base region and said electrode and also by the selected potential difference between said emitter and collector regions.

2. The method of selectively plating a transistor of semiconductor material which includes in succession a P-type collector region, a rectification barrier, an N-type diffused base region of smaller cross section than that of said collector region, a rectification barrier, and a P-type emitter region which is of smaller cross section than that of said base region and is alloyed to said base region, comprising: immersing said transistor in a metal plating solution while simultaneously applying selected potentials which maintain said base region (*a*) cathodic with respect to an electrode immersed in said solution and (*b*) more cathodic by an adjustable amount with respect to said emitter region than it is with respect to said collector region, whereby the flow of plating current for an interval of time is ineffective to plate with said metal of said solution said collector and emitter regions and said barriers but is effective to plate with said metal an area of said base region having a size which is controllable by the selected potential difference appearing between said base region and said electrode and also by the selected potential difference between said emitter and collector regions.

References Cited in the file of this patent

UNITED STATES PATENTS

| | | |
|---|---|---|
| 2,694,040 | Davis et al. | Nov. 9, 1954 |
| 2,802,159 | Stump | Aug. 6, 1957 |
| 2,823,175 | Roschen | Feb. 11, 1958 |
| 2,846,346 | Bradley | Aug. 5, 1958 |
| 2,893,929 | Schnable | July 7, 1959 |